United States Patent
Gore et al.

(10) Patent No.: US 9,722,626 B2
(45) Date of Patent: Aug. 1, 2017

(54) METHOD AND SYSTEM USING COMPUTATIONAL SIGMA-DELTA MODULATORS

(71) Applicant: General Electric Company, Schenectady, NY (US)

(72) Inventors: Amit Satish Gore, Glenville, NY (US); Emad Andarawis Andarawis, Ballston Lake, NY (US); Naresh Kesavan Rao, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 298 days.

(21) Appl. No.: 14/589,484

(22) Filed: Jan. 5, 2015

(65) Prior Publication Data

US 2016/0197620 A1    Jul. 7, 2016

(51) Int. Cl.
*H03M 3/00*  (2006.01)
*G01D 5/22*  (2006.01)

(52) U.S. Cl.
CPC ............ H03M 3/35 (2013.01); *G01D 5/2291* (2013.01); *H03M 3/466* (2013.01)

(58) Field of Classification Search
CPC .................................. H03M 3/35; H03M 3/30
USPC ........................................ 341/143, 155, 144
See application file for complete search history.

(56) References Cited

U.S. PATENT DOCUMENTS

| | | | |
|---|---|---|---|
| 5,148,167 A | 9/1992 | Ribner | |
| 6,111,531 A * | 8/2000 | Farag | H03M 3/40 341/143 |
| 6,249,238 B1 | 6/2001 | Steinlechner | |
| 7,180,432 B2 * | 2/2007 | Oliaei | H03M 3/40 341/143 |
| 2009/0066550 A1 | 3/2009 | Hammerschmidt | |
| 2010/0176976 A1 | 7/2010 | Breems et al. | |

(Continued)

FOREIGN PATENT DOCUMENTS

| | | |
|---|---|---|
| CN | 1057741 A | 1/1992 |
| WO | 0219532 A2 | 3/2002 |

OTHER PUBLICATIONS

Yassa et al., "A Multichannel Digital Demodulator for LVDT/RVDT Position Sensors", Solid-State Circuits, IEEE Journal of, vol. 25, Issue 2, pp. 441-450, Apr. 1990.

(Continued)

*Primary Examiner* — Peguy Jean Pierre
(74) *Attorney, Agent, or Firm* — John P. Darling

(57) ABSTRACT

An analog-to-digital converter (ADC) is provided includes a first sigma-delta modulator (SDM) electrically coupled to a first signal input. The first SDM includes a first summing junction configured to receive a plurality of inputs to the first SDM. The ADC further includes a second sigma-delta modulator (SDM) electrically coupled to a second signal input. The second SDM includes a second summing junction configured to receive a plurality of inputs to the second SDM. The first SDM also includes a cross-coupled feedback loop from an output of the first SDM to a negative input of the first summing junction and to a positive input of the second summing junction. The second SDM also includes a cross-coupled feedback loop from an output of the second SDM to a negative input of the first summing junction and to a negative input of the second summing junction.

18 Claims, 4 Drawing Sheets

(56) References Cited

U.S. PATENT DOCUMENTS

2014/0285189 A1* 9/2014 Kashmiri ............... G01R 33/04
324/253
2014/0368368 A1* 12/2014 Koli ...................... H03M 3/462
341/143

OTHER PUBLICATIONS

Kavusi et al., "On Incremental Sigma-Delta Modulation with Optimal Filtering", IEEE Transactions on Circuits and Systems—I: Regular Papers, pp. 1-16, 2005.
Wang, "Sigma-Delta Modulation Based Distributed Detection in Wireless Sensor Networks", A Thesis Submitted to the Graduate Faculty of the Louisiana State University and Agricultural and Mechanical College, pp. 1-91, 2007.
Wynne, "Circuit Suggestions Using Features and Functionality of New Sigma-Delta ADCs—Part 2", Analog Devices, pp. 1-8.

* cited by examiner

METHOD AND SYSTEM USING COMPUTATIONAL SIGMA-DELTA MODULATORS

BACKGROUND

The field of the disclosure relates generally to computational sigma-delta modulators (SDM) and, more particularly, to sensing a position or proximity of linear voltage differential transformer using computational sigma-delta modulators.

In at least some known signal processing devices or circuits, quantization error is introduced with each computational step, which causes a reduction in accuracy of the final signal. Moreover, each computational step is associated with one or more components used to perform the associated computational step. Generally, reducing a number of components in a signal processing circuit tends to reduce the total quantization error introduced by the signal processing device. Additionally, reducing a number of components in the signal processing circuit tends to permit greater miniaturization of the signal processing circuit and a lower power draw of the signal processing circuit.

Known devices, such as multichannel sigma-delta modulators have been used in an attempt to improve the accuracy of a signal using, for example, but not limited to, an oversampling parallel sigma-delta modulator (SDM). Similarly, another family of known devices to improve the accuracy of a signal are signal decorrelating sigma-delta modulators that decorrelate signals in a multidimensional sensory array. In a signal decorrelating architecture, the number of reference channels is always less than the dimension of the multichannel system. Therefore the computation is of the form:

$$Dm = \Sigma_{k=1}^{m-1} Ak*Xk, \qquad \text{Eq. (1)}$$

where A is the weight coefficient, Xk are the lower dimensional input signals. In a signal decorrelating analog-to-digital converter (ADC), one reference signal is required for signal reconstruction. However, such known techniques implement computations of signals with a quantization error penalty.

BRIEF DESCRIPTION

In one embodiment, an analog-to-digital converter (ADC) is provided. The ADC includes a first sigma-delta modulator (SDM) electrically coupled to a first signal input. The first SDM includes a first summing junction configured to receive a plurality of inputs to the first SDM. The ADC further includes a second SDM electrically coupled to a second signal input. The second SDM includes a second summing junction configured to receive a plurality of inputs to the second SDM. The first SDM also includes a cross-coupled feedback loop from an output of the first SDM to a negative input of the first summing junction and to a positive input of the second summing junction. The second SDM also includes a cross-coupled feedback loop from an output of the second SDM to a negative input of the first summing junction and to a negative input of the second summing junction.

In another embodiment, a method of computing a plurality of signals using a reduced set of computational components includes receiving a first signal of a plurality of signals at an input of a first sigma-delta modulator (SDM). The method also includes receiving a second signal of a plurality of signals at an input of a second SDM. The method further includes combining the first signal with a first feedback signal from an output of the first SDM and a second feedback signal from an output of the second SDM. The method also includes combining the second signal with the first feedback signal and the second feedback signal.

In yet another embodiment, a position indicating system includes a linear voltage differential transformer (LVDT) including an excitation winding configured to receive an electrical excitation current. The system also includes a secondary winding including a first and a second coil coupled in electrical series and wound differentially. The system further includes a movable core configured to translate along a path of travel. The movable core is configured to magnetically couple the excitation winding and the secondary winding based on a position of the movable core. The position indicating system also includes a first sigma-delta modulator (SDM) electrically coupled to the first coil. The first SDM includes a first summing junction configured to receive a plurality of inputs to the first SDM. The position indicating system also includes a second SDM electrically coupled to the second coil. The second SDM includes a second summing junction configured to receive a plurality of inputs to the second SDM. The first SDM includes a cross-coupled feedback loop from an output of the first SDM to a negative input of the first summing junction and to a positive input of the second summing junction. The second SDM includes a cross-coupled feedback loop from an output of the second SDM to a negative input of the first summing junction and to a negative input of the second summing junction.

DRAWINGS

These and other features, aspects, and advantages of the present disclosure will become better understood when the following detailed description is read with reference to the accompanying drawings in which like characters represent like parts throughout the drawings, wherein.

Figure 1:
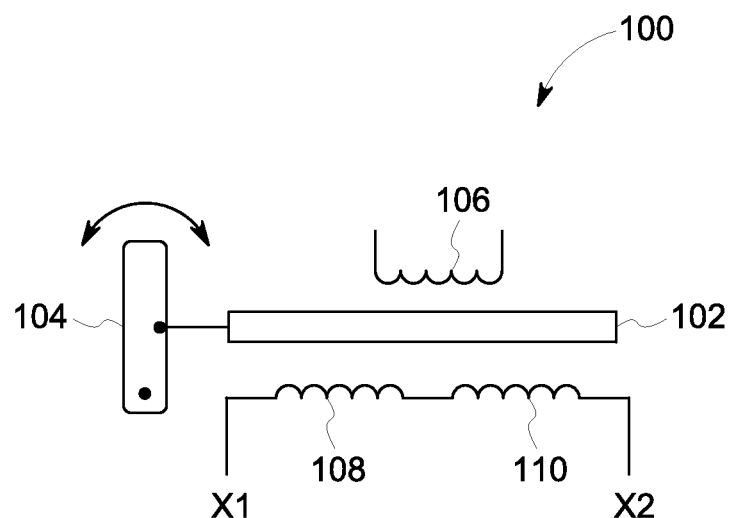
FIG. 1 is a block diagram of an exemplary linear voltage differential transformer (LVDT)

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure describe a computation of signals from, for example, a linear voltage differential transformer (LVDT) that reduces a quantization error of the signals. Specifically, the architecture described herein produces one addition and one subtraction output compared to two digitized streams of a conventional two-dimensional (2D) system. Additional hardware is required to perform the two computations which is a function of an accuracy of bits. Moreover, application specific cross-coupled coefficients substantially reduce the need of any external hardware/digital signal processor to process LVDT sensor signals.

The embodiments described herein relate to a technique to perform fundamental signal computations embedded within analog-to-digital converters (ADC) such as addition, subtraction, and combinations of those computations. Fundamental computations are performed in the digitization process of analog signals without adding any quantization error in the computed signals. In conventional signal processing, the computations are performed after digitization of the analog signal, therefore the conventional approach adds computational error in addition to the quantization error. In the exemplary embodiments, the accuracy of the signal computation is only dependent on the quantization error of the digitization of analog signals. The techniques described herein facilitate reducing quantization error in sensory signal applications such as control systems, bio-sensing, and monitoring where signal processing based on fundamental computational steps is required for controls and analysis. Every computation step adds error in measured sensor signal which itself is limited by the quantization error of the ADC during digitization. For high precision sensing, every informational bit is important, so measures are taken to reduce computational steps without losing precision. Sigma-delta modulator ADCs can be configured for high resolution and high accuracy sensor measurements where the accuracy is determined by quantization error. In multichannel sensory systems, computation of signals degrades the accuracy of the processed signals due to additions of quantization errors in quadrature, i.e., addition of two signals increases the error by approximately $\sqrt{2}$ or 41%. In the exemplary embodiments, the computation of the two signals is still limited to the quantization error of a single analog-to-digital converter.

Embodiments of the present disclosure are based on computation of two signals in a 2-dimensional (2D) sigma-delta framework. Higher order computations are obtained by cascading the 2D architecture. In 2D design, two sigma-delta modulators are used to interface two analog sensor signals. In conventional design, these two sigma-delta modulators individually digitize the analog signals. In contrast to the conventional design, and as described herein, the two sigma-delta modulators interact with each other in a cross-coupling of the feedback loops. The digitized bit(s) of each modulator output is fed back to the inputs using additional cross coupled feedback. In this case the first sigma-delta modulator receives a negative feedback signal from the digital output of the second sigma-delta modulator, whereas the second sigma-delta modulator receives a positive feedback signal from the digital output of the first sigma-delta modulator. The given 2D configuration gives two outputs which represent $(X_1+X_2)/2$ and $(X_1-X_2)/2$, respectively. These computations are obtained at the cost of a single quantization error caused by the individual modulators. Higher dimensional computations are obtained by cascading 2D architectures. The averaging weights can be changed by adjusting the computational weights of the cross-coupled feedback.

Embodiments of the present disclosure address a fundamental issue of reducing quantization error in signal processing. With every computation step (except averaging) accuracy degrades. The present technique provides an alternative route for signal processing where fundamental basic operations can be performed without degrading the accuracy of signals. This technique eliminates signal processing hardware and enables miniaturized electronic systems. Such techniques find a wide range of applications, including process controls and bio-sensing. For example, in an LVDT displacement sensor, the required computation of $(a+b)/(a-b)$ is performed by interfacing two secondary coil signals to computational sigma-delta modulators. LVDT based displacement sensors are used in, for example, distributed control system (DCS) modules. As a further example, healthcare commercial products are used for vital sign monitoring. In those systems, the relative strength and accuracy of signals of interest are boosted using computational sigma-delta modulators configured as described herein. Breathing rate monitors can use computational sigma-delta modulators to improve signal to noise ratios of breathing signals in the presence of motion artifacts. Although described in terms of reduces noise associated with converting sensor signals, the fundamental technique as applied to sigma-delta modulator ADCs is not limited to any specific application domain or business but could be used anywhere where high precision computation is desired.

FIG. 1 is a block diagram of an exemplary linear voltage differential transformer (LVDT) 100. In the exemplary embodiment, LVDT 100 includes a moving core 102 configured to be coupled to a movable device 104 whose displacement is to be measured. LVDT 100 includes a primary or excitation winding 106 for receiving an excitation signal, for example, but not limited to, a sine wave excitation signal. LVDT 100 also includes a pair of secondary windings 108 and 110 coupled out of phase and in electrical series and configured to provide LVDT output signals $X_1$ and $X_2$.

Figure 2:
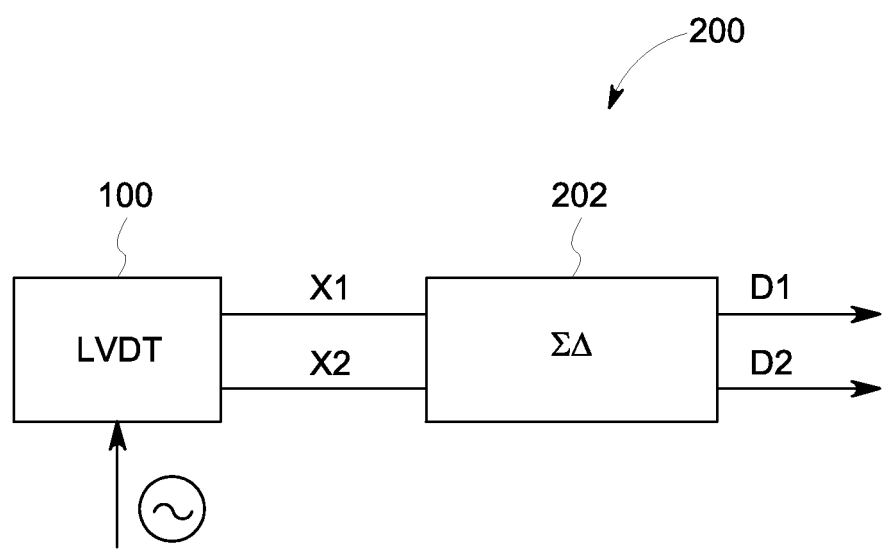
FIG. 2 is a schematic block diagram of an exemplary LVDT circuit that may be used with the LVDT shown in FIG. 1.

FIG. 2 is a schematic block diagram of an exemplary LVDT circuit 200. In the exemplary embodiment, LVDT circuit 200 includes LVDT 100 electrically coupled to a sigma-delta modulator (SDM) circuit 202 configured to convert analog inputs $X_1$ and $X_2$ to digital signals $D_1$ and $D_2$ with reduced noise as compared to known LVDT 100 circuits.

Figure 3:
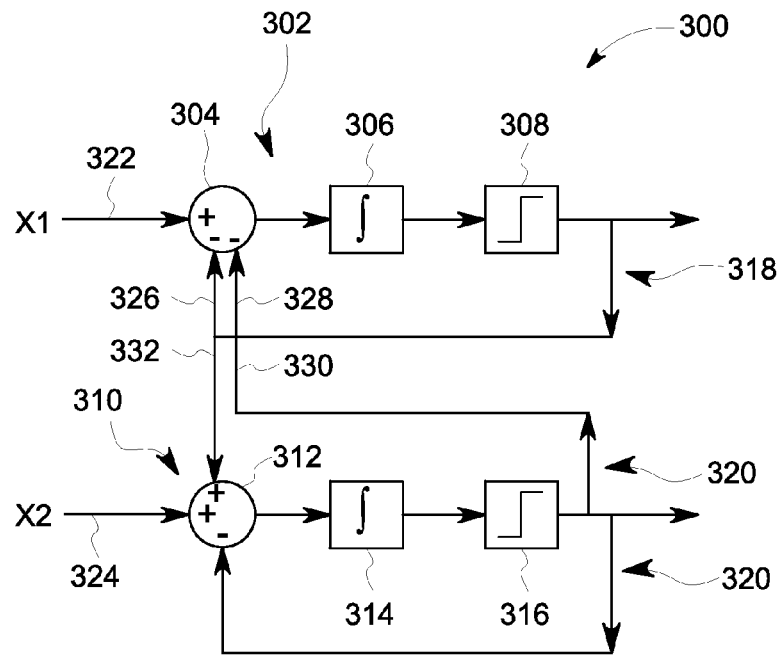
FIG. 3 is a block diagram of an exemplary analog-to-digital converter (ADC) that includes cross-coupled feedback loops that may be used with the LVDT circuit shown in FIG. 2.

FIG. 3 is a block diagram of an analog-to-digital converter (ADC) 300 that includes cross-coupled feedback loops 318 and 320 that may be used with LVDT circuit 200 (shown in FIG. 2). In the exemplary embodiment, a first sigma-delta modulator (SDM) 302 includes an input summing junction 304, an integrator stage 306, and a quantizer 308 in a series arrangement. A second SDM 310 includes an input summing junction 312, an integrator stage 314, and a quantizer 316 in a series arrangement. First SDM 302 includes a feedback loop 318 that cross-couples an output of quantizer 308 to a negative input of summing junction 304 and to a positive input of summing junction 312. Second SDM 310 includes a feedback loop 320 that cross-couples an output of quantizer 316 to a negative input of summing junction 304 and to a negative input of summing junction 312.

During operation, input signals $X_1$ and $X_2$ from, for example, secondary windings 108 and 110 are applied to respective inputs 322 and 324 of first SDM 302 and second SDM 310. Input signals $X_1$ and $X_2$ are analog signals, specifically sine wave signals that relate to a position of movable core 102 (shown in FIG. 1). Input signal $X_1$ is combined with cross-coupled feedback signals 326 and 328 at summing junction 304. Input signal $X_2$ is combined with cross-coupled feedback signals 330 and 332 at summing junction 312.

Figure 4:
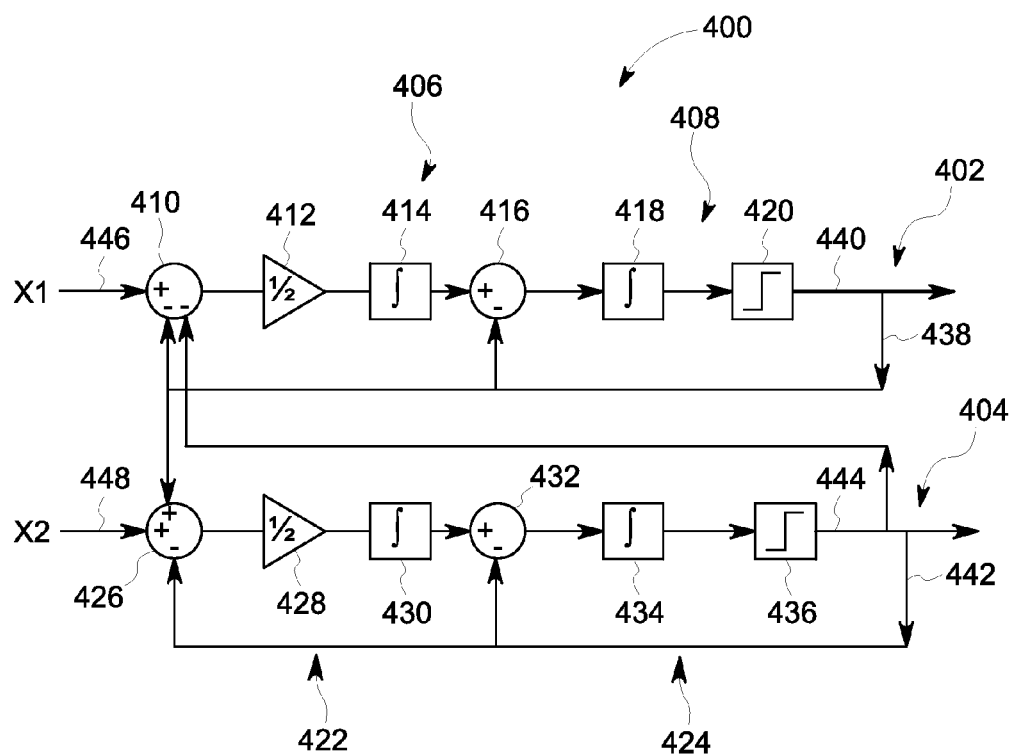
FIG. 4 is a block diagram of an alternative embodiment of an analog-to-digital converter (ADC) that includes two single-loop second-order SDMs, each with a single cross-coupled feedback loop shown in FIG. 3.

FIG. 4 is a block diagram of an analog-to-digital converter (ADC) 400 that includes two single-loop second-order SDMs 402 and 404, each with a single cross-coupled feedback loop 438 and 442, respectively. In the exemplary embodiment, ADC 400 includes a first second-order single-loop SDM 402 and a second second-order single-loop SDM 404.

First SDM 402 includes a first stage 406 and a second stage 408 in a series arrangement. First stage 406 includes an input summing junction 410, a gain amplifier 412, and an integrator stage 414 in a series arrangement. Second stage 408 includes a summing junction 416, an integrator stage 418, and a quantizer 420 in a series arrangement.

Second SDM 404 includes a first stage 422 and a second stage 424 in a series arrangement. First stage 422 includes an input summing junction 426, a gain amplifier 428, and an integrator stage 430 in a series arrangement. Second stage 424 includes a summing junction 432, an integrator stage 434, and a quantizer 436 in a series arrangement.

First SDM 402 also includes a feedback loop 438 that cross-couples an output 440 of quantizer 420 to a negative input of summing junction 410, a negative input of summing junction 416, and to a positive input of summing junction 426.

Second SDM 404 also includes a feedback loop 442 that cross-couples an output 444 of quantizer 436 to a negative input of summing junction 432, a negative input of summing junction 426, and to a negative input of summing junction 410.

During operation, input signals $X_1$ and $X_2$ from, for example, secondary windings 108 and 110 (shown in FIG. 1), respectively, are applied to respective inputs 446 and 448 of first SDM 402 and second SDM 404. Input signals $X_1$ and $X_2$ are analog signals, specifically, for example, sine wave signals that relate to a position of movable core 102 (shown in FIG. 1). Input signal $X_1$ is combined with cross-coupled feedback signals 438 and 442 at summing junction 410. Input signal $X_2$ is combined with cross-coupled feedback signals 438 and 442 at summing junction 426. Gain amplifiers 412 and 428 are configured to weight respective outputs 440 and 444 for computational averaging.

Figure 5:
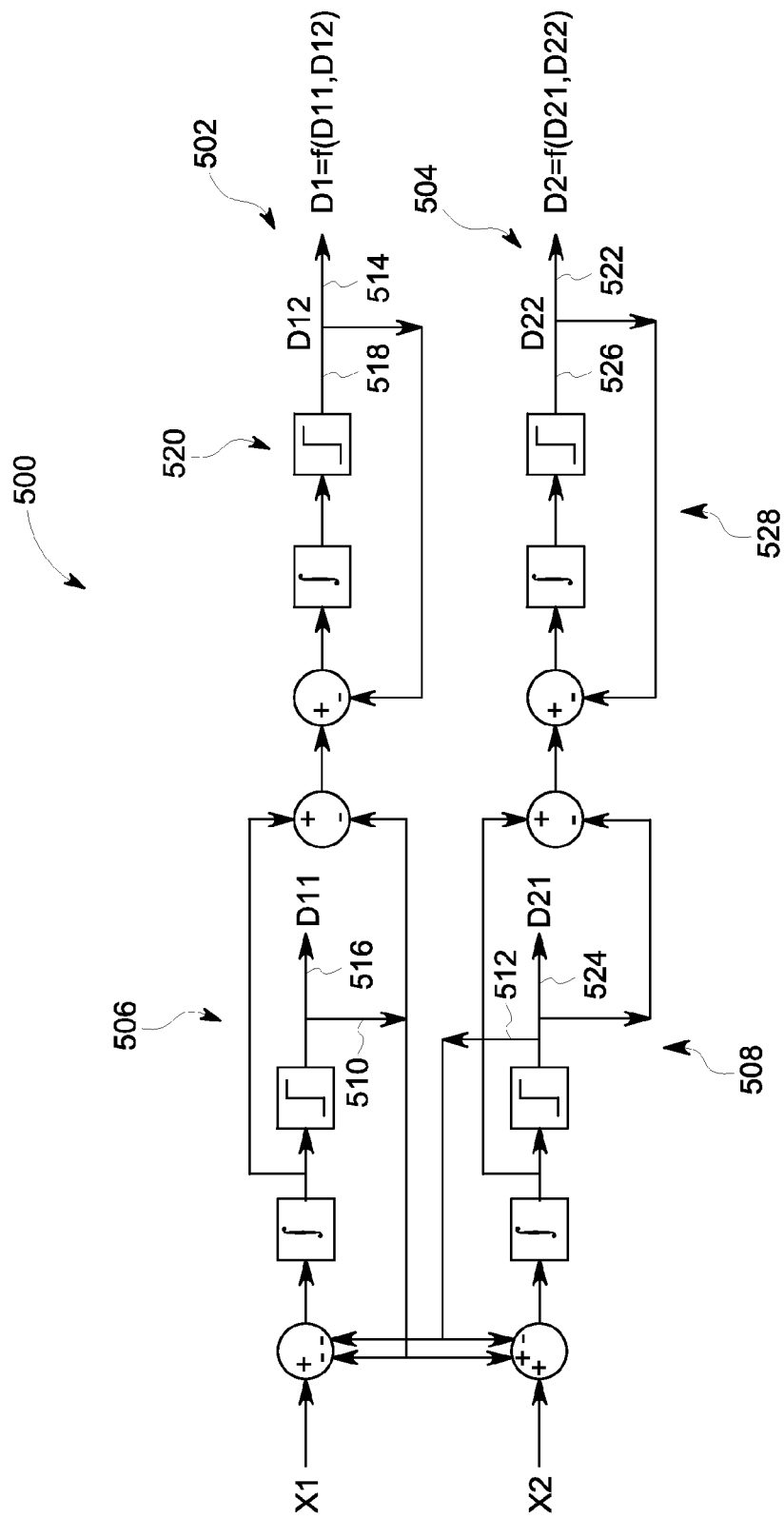
FIG. 5 is a block diagram of another alternative embodiment of an analog-to-digital converter (ADC) that includes two cascaded first-order SDMs, a first stage of each cascaded SDM includes a single cross-coupled feedback loop.

FIG. 5 is a block diagram of an analog-to-digital converter (ADC) 500 that includes two cascaded first-order SDMs 502, 504. Each cascaded SDM 502, 504 includes a first stage 506, 508 (respectively), and a single cross-coupled feedback loop 510, 512 (respectively). In the exemplary embodiment, ADC 500 receives input signals $X_1$ and $X_2$ from, for example, secondary windings 108 and 110 (shown in FIG. 1), respectively. Input signals $X_1$ and $X_2$ are analog signals, specifically, for example, sine wave signals that relate to a position of movable core 102 (shown in FIG. 1). An output 514 of SDM 502 is a function of an output 516 of first stage 506 and an output 518 of a second stage 520 of SDM 502, as given by:

$$D_1 = f(D11, D12) \qquad \text{Eq. (2)}$$

where $D_1$ represents output 514,
D11 represents output 516, and
D12 represents output 518.

An output 522 of SDM 504 is a function of an output 524 of first stage 508 and an output 526 of a second stage 528 of SDM 504, as given by:

$$D_2 = f(D21, D22) \qquad \text{Eq. (3)}$$

where $D_2$ represents output 522,
D21 represents output 524, and
D22 represents output 526.

In addition to the illustrated configurations, additional stages of SDMs and multiple loops of feedback are possible within the scope of the descriptions in the present disclosure.

Figure 6:
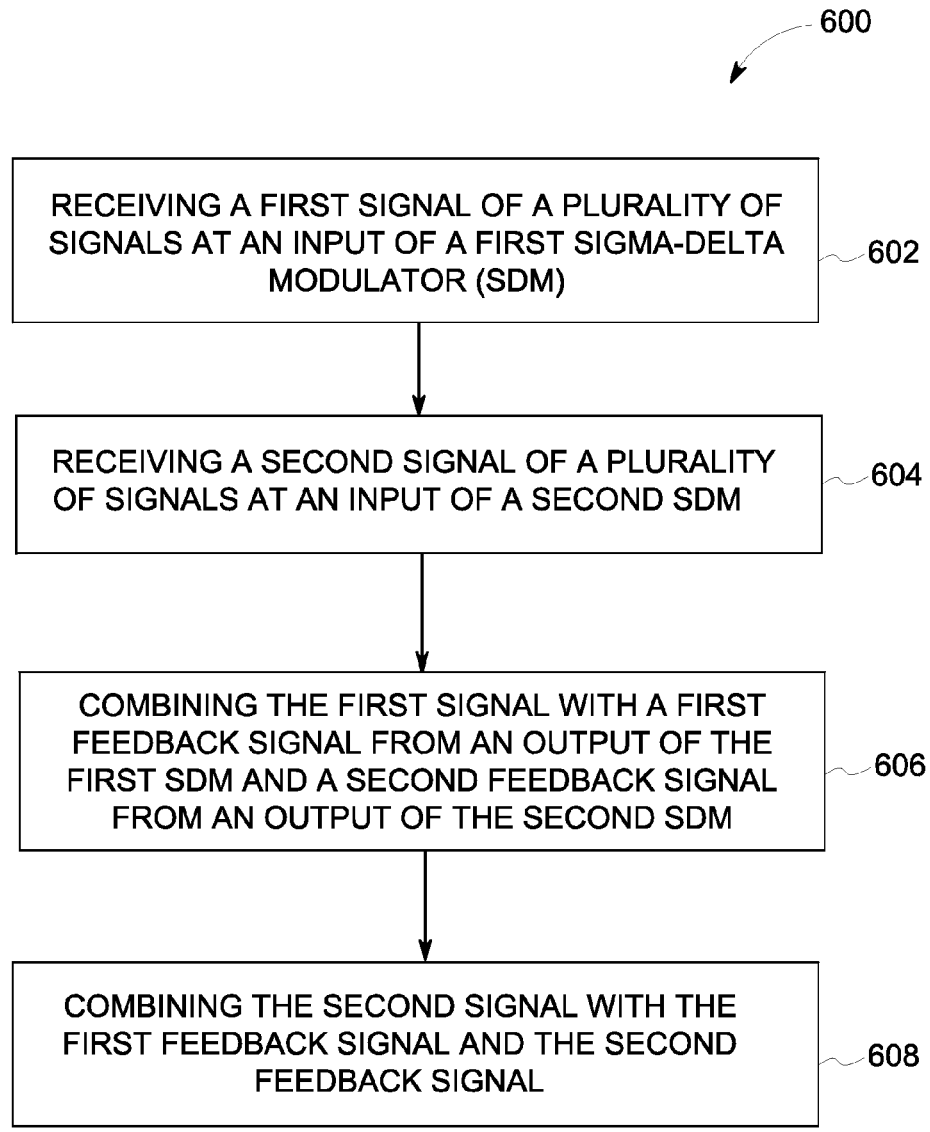
FIG. 6 is a flow chart of a method of computing a plurality of signals using a reduced set of computational components.

FIG. 6 is a flow chart of a method 600 of computing a plurality of signals using a reduced set of computational components. In the exemplary embodiment, method 600 includes receiving 602 a first signal 322 of a plurality of signals at an input of a first sigma-delta modulator (SDM) 302 and receiving a second signal 324 of a plurality of signals at an input of a second SDM 310. Method 600 also includes combining first signal 322 with a first feedback signal 326 from an output of first SDM 302 and a second feedback signal 328 from an output of second SDM 310 and combining second signal 324 with first feedback signal 326 and second feedback signal 328. In various embodiments, first SDM 302 and second SDM 310 are electrically coupled to respective output coils of a linear voltage differential transformer (LVDT).

The output of first SDM 302 is given by:

$$D_1 = D\left(\frac{V_A + V_B}{2}\right) \qquad \text{Eq. (4)}$$

where
$D_1$ represents the digital output of first SDM 302,
D represents a constant,
$V_A$ represents the analog input of first SDM 302, and
$V_B$ represents the analog input of second SDM 310.

The output of second SDM 310 is given by:

$$D_2 = D\left(\frac{V_A - V_B}{2}\right) \qquad \text{Eq. (5)}$$

where
D₂ represents the digital output of second SDM 310,
D represents a constant,
$V_A$ represents the analog input of first SDM 302, and
$V_B$ represents the analog input of second SDM 310.

In various embodiments, at least one of first summing junction 304 and second summing junction 312 is configured to combine an analog input signal with a plurality of digital feedback signals.

The above described ADC using a plurality of SDMs having cross-connected feedback loops facilitate reducing quantization error introduced at each additional processing step over know ADCs. For example, a fundamental difference between the signal decorrelating architecture described above with respect to the known art and the computational sigma-delta ADC of the present disclosure is the number of reference channels. In the signal decorrelating architecture, the reference channels are always less than the dimension of the multichannel system. Therefore computation is of the form:

$$Dm = \Sigma_{k=1}^{m-1} Ak*Xk,  \quad \text{Eq. (1)}$$

where A is the weight coefficient and Xk are the lower dimensional input signals. In the present disclosure, all signals are used for computation, which is of the form:

$$Dm = \Sigma_{k=1}^{m} Ak*Xk. \quad \text{Eq. (7)}$$

In a signal decorrelating ADC, one reference signal is required for signal reconstruction, whereas in the present disclosure all signals are recovered without any reference signal.

The above described linear voltage differential transformer (LVDT) systems provide a cost-effective method for digitizing an output of an LVDT without additional quantization error using a reduced set of computational components. The embodiments described herein use a pair of sigma-delta modulator chains having cross-connected feedback to provide the digitization of the input analog signals without the need for additional digitizing components. Therefore, the embodiments described herein substantially reduce the quantization error introduced when additional computational components are used.

An exemplary technical effect of the methods, systems, and apparatus described herein includes at least one of: (a) receiving a first signal of a plurality of signals at an input of a first sigma-delta modulator (SDM); (b) receiving a second signal of a plurality of signals at an input of a second SDM; (c) combining the first signal with a first feedback signal from an output of the first SDM and a second feedback signal from an output of the second SDM; and (d) combining the second signal with the first feedback signal and the second feedback signal.

Exemplary embodiments of methods, systems, and apparatus for converting LVDT outputs from analog-to-digital representations are not limited to the specific embodiments described herein, but rather, components of systems and/or steps of the methods may be utilized independently and separately from other components and/or steps described herein. For example, the methods may also be used in combination with other ADC systems, and are not limited to practice with only the LVDTs and methods as described herein. Rather, the exemplary embodiment can be implemented and utilized in connection with many other applications, equipment, and systems that may benefit from analog-to-digital conversion with reduced quantization error and reduced computational components.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An analog-to-digital converter (ADC) comprising:
a first sigma-delta modulator (SDM) electrically coupled to a first signal input, said first SDM comprising a first summing junction configured to receive a plurality of inputs to said first SDM;
a second sigma-delta modulator (SDM) electrically coupled to a second signal input, said second SDM comprising a second summing junction configured to receive a plurality of inputs to said second SDM, said first SDM comprising a cross-coupled feedback loop extending from an output of said first SDM to a negative input of said first summing junction and to a positive input of said second summing junction, said second SDM comprising a cross-coupled feedback loop extending from an output of said second SDM to a negative input of said first summing junction and to a negative input of said second summing junction; and
a first gain amplifier and a second gain amplifier that selectively adjust a computational weight of the cross-coupled feedback to at least one of the first SDM and the second SDM to change the average weights of the first SDM and the second SDM.

2. The ADC of claim 1, wherein at least one of said first SDM and said second SDM comprises a plurality of cascaded SDMs.

3. The ADC of claim 2, wherein said plurality of cascaded SDMs comprises an output of a first quantizer section electrically coupled in series with an input of a second quantizer section.

4. The ADC of claim 1, wherein at least one of said first SDM and said second SDM comprises a plurality of quantizer stages.

5. The ADC of claim 1, wherein the output of said first SDM is given by:

$$D_2 = D\left(\frac{V_A - V_B}{2}\right), \text{ where}$$

$D_1$ represents a digital output of said first SDM,
D represents a constant,
$V_A$ represents an analog input of said first SDM, and
$V_B$ represents an analog input of said second SDM.

6. The ADC of claim 1, wherein the output of said second SDM is given by:

$$D_1 = D\left(\frac{V_A + V_B}{2}\right), \text{ where}$$

$D_2$ represents a digital output of said second SDM,
D represents a constant,
$V_A$ represents an analog input of said first SDM, and
$V_B$ represents an analog input of said second SDM.

7. The ADC of claim 1, wherein at least one of said first summing junction and said second summing junction is configured to combine an analog input signal with a plurality of digital feedback signals.

8. The ADC of claim 1, wherein said first SDM and said second SDM are electrically coupled to respective output coils of a linear voltage differential transformer (LVDT).

9. A method of computing a plurality of signals using a reduced set of computational components, said method comprising:
receiving a first signal of a plurality of signals at an input of a first sigma-delta modulator (SDM);
receiving a second signal of the plurality of signals at an input of a second SDM;
combining the first signal with a first feedback signal from an output of the first SDM and a second feedback signal from an output of the second SDM; and
combining the second signal with the first feedback signal and the second feedback signal, wherein combining the second signal with the first feedback signal and the second feedback signal comprises combining, in a second summing junction, the second signal with the first feedback signal applied to an additive input to the second summing junction, further comprising selectively adjusting a computational weight of the cross-coupled feedback to at least one of the first SDM and the second SDM to change the average weights of the first SDM and the second SDM.

10. The method of claim 9, wherein at least one of combining the first signal and combining the second signal comprises combining an analog input signal with a plurality of digital feedback signals.

11. The method of claim 9, wherein combining the first signal with a first feedback signal from an output of the first SDM a second feedback signal from an output of the second SDM comprises combining, in a first summing junction, the first signal with the first feedback signal applied to a subtractive input to the first summing junction.

12. The method of claim 11, wherein combining the first signal with a first feedback signal from an output of the first SDM and a second feedback signal from an output of the second SDM comprises combining, in the first summing junction, the first signal with the second feedback signal applied to a subtractive input to the first summing junction.

13. The method of claim 9, wherein combining the second signal with the first feedback signal and the second feedback signal comprises combining, in the second summing junction, the second signal with the second feedback signal applied to a subtractive input to the second summing junction.

14. A position indicating system comprising:
a linear voltage differential transformer (LVDT) comprising:
an excitation winding, configured to receive an electrical excitation current;
a secondary winding comprising a first and a second coil coupled in electrical series and wound differentially; and
a movable core configured to translate along a path of travel, the movable core configured to magnetically couple said excitation winding and said secondary winding based on a position of the movable core;
a first sigma-delta modulator (SDM) electrically coupled to said first coil, said first SDM comprising a first summing junction configured to receive a plurality of inputs to said first SDM;
a second sigma-delta modulator (SDM) electrically coupled to said second coil, said second SDM comprising a second summing junction configured to receive a plurality of inputs to said second SDM, said first SDM comprising a cross-coupled feedback loop extending from an output of said first SDM to a negative input of said first summing junction and to a positive input of said second summing junction, said second SDM comprising a cross-coupled feedback loop extending from an output of said second SDM to a negative input of said first summing junction and to a negative input of said second summing junction; and
a first gain amplifier and a second gain amplifier that selectively adjust a computational weight of the cross-coupled feedback to at least one of the first SDM and the second SDM to change the average weights of the first SDM and the second SDM.

15. The system of claim 14, wherein at least one of said first SDM and said second SDM comprises a plurality of cascaded SDMs.

16. The system of claim 14, wherein at least one of said first SDM and said second SDM comprises a plurality of quantizer stages.

17. The system of claim 14, wherein the output of said first SDM is given by:

$$D_2 = D\left(\frac{V_A - V_B}{2}\right), \text{ where}$$

$D_1$ represents a digital output of said first SDM,
D represents a constant,
$V_A$ represents an analog input of said first SDM, and
$V_B$ represents an analog input of said second SDM.

18. The system of claim 14, wherein the output of said second SDM is given $$D_2 = D\left(\frac{V_A - V_B}{2}\right), \text{ where}$$

$D_2$ represents a digital output of said second SDM,
represents a constant,
$V_A$ represents an analog input of said first SDM, and
$V_B$ represents an analog input of said second SDM.

* * * * *